United States Patent
Liu et al.

(10) Patent No.: US 12,271,113 B2
(45) Date of Patent: *Apr. 8, 2025

(54) METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Chih-Cheng Liu, Hsinchu (TW); Yi-Chen Kuo, Taichung (TW); Jia-Lin Wei, Hsinchu (TW); Ming-Hui Weng, New Taipei (TW); Yen-Yu Chen, Taipei (TW); Jr-Hung Li, Chupei (TW); Yahru Cheng, Taipei (TW); Chi-Ming Yang, Hsinchu (TW); Tze-Liang Lee, Hsinchu (TW); Ching-Yu Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 969 days.

This patent is subject to a terminal disclaimer.

(21) Appl. No.: 17/150,389

(22) Filed: Jan. 15, 2021

(65) Prior Publication Data
US 2021/0302839 A1    Sep. 30, 2021

Related U.S. Application Data

(60) Provisional application No. 63/025,957, filed on May 15, 2020, provisional application No. 63/002,247, filed on Mar. 30, 2020.

(51) Int. Cl.
*G03F 7/16* (2006.01)
*G03F 7/11* (2006.01)
*H01L 21/027* (2006.01)
*G03F 7/20* (2006.01)

(52) U.S. Cl.
CPC ............... *G03F 7/167* (2013.01); *G03F 7/11* (2013.01); *H01L 21/0274* (2013.01); *G03F 7/2004* (2013.01)

(58) Field of Classification Search
CPC ....... G03F 7/167; G03F 7/0044; G03F 7/0042
See application file for complete search history.

(56) References Cited

U.S. PATENT DOCUMENTS

| | | |
|---|---|---|
| 7,297,466 B2 | 11/2007 | Lee et al. |
| 7,465,527 B2 | 12/2008 | Kon et al. |
| 8,796,666 B1 | 8/2014 | Huang et al. |
| 9,093,530 B2 | 7/2015 | Huang et al. |
| 9,213,234 B2 | 12/2015 | Chang |
| 9,223,220 B2 | 12/2015 | Chang |
| 9,256,133 B2 | 2/2016 | Chang |
| 9,310,684 B2 | 4/2016 | Meyers et al. |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 11,705,332 B2 * | 7/2023 | Kuo ............ H01L 21/0275 438/680 |
| 11,822,237 B2 * | 11/2023 | Weng ............ G03F 7/0042 |
| 2012/0088193 A1 | 4/2012 | Weidman et al. |
| 2012/0088369 A1 | 4/2012 | Weidman et al. |
| 2017/0102612 A1 * | 4/2017 | Meyers ............ G03F 7/38 |
| 2017/0146909 A1 | 5/2017 | Smith et al. |
| 2019/0137870 A1 | 5/2019 | Meyers et al. |
| 2019/0237341 A1 | 8/2019 | Yu et al. |
| 2020/0058492 A1 | 2/2020 | Singhal et al. |
| 2021/0271170 A1 * | 9/2021 | Telecky ............ G03F 7/38 |

FOREIGN PATENT DOCUMENTS

| | | | |
|---|---|---|---|
| EP | 3598232 A1 | 1/2020 | |
| JP | 61121332 A * | 6/1986 | ............ H01L 21/30 |
| JP | 2003-162060 A | 6/2003 | |
| KR | 1020190074004 A | 6/2019 | |
| KR | 1020040015955 A | 2/2021 | |

(Continued)

OTHER PUBLICATIONS

English Translation of JP 61121332-A. (Year: 1986).*
Notice of Allowance issued in corresponding Korean Application No. 10-2021-0033931, dated Nov. 9, 2022, with English translation.

*Primary Examiner* — Daborah Chacko-Davis
(74) *Attorney, Agent, or Firm* — STUDEBAKER BRACKETT PLLC

(57) ABSTRACT

Method of manufacturing semiconductor device includes forming photoresist layer over substrate. Forming photoresist layer includes combining first precursor and second precursor in vapor state to form photoresist material, wherein first precursor is organometallic having formula: $M_a R_b X_c$, where M at least one of Sn, Bi, Sb, In, Te, Ti, Zr, Hf, V, Co, Mo, W, Al, Ga, Si, Ge, P, As, Y, La, Ce, Lu; R is substituted or unsubstituted alkyl, alkenyl, carboxylate group; X is halide or sulfonate group; and $1 \leq a \leq 2$, $b \geq 1$, $c \geq 1$, and $b+c \leq 5$. Second precursor is at least one of an amine, a borane, a phosphine. Forming photoresist layer includes depositing photoresist material over the substrate. The photoresist layer is selectively exposed to actinic radiation to form latent pattern, and the latent pattern is developed by applying developer to selectively exposed photoresist layer to form pattern.

20 Claims, 21 Drawing Sheets

(56) References Cited

FOREIGN PATENT DOCUMENTS

| | | |
|---|---|---|
| TW | 201224190 A | 6/2012 |
| TW | 202010746 A | 3/2020 |
| WO | 2019/152363 A1 | 8/2019 |
| WO | 2019/217749 A1 | 11/2019 |

* cited by examiner

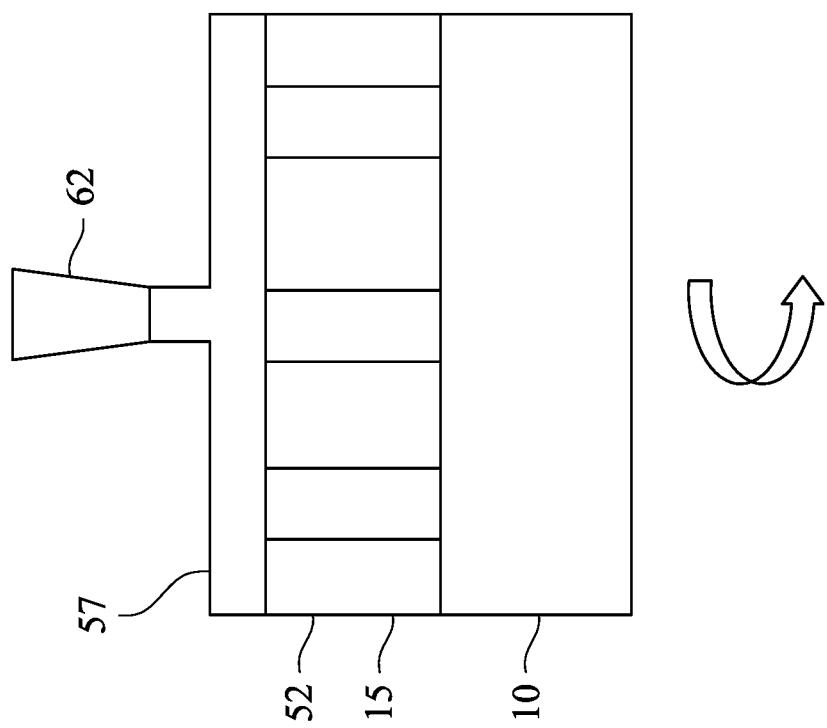

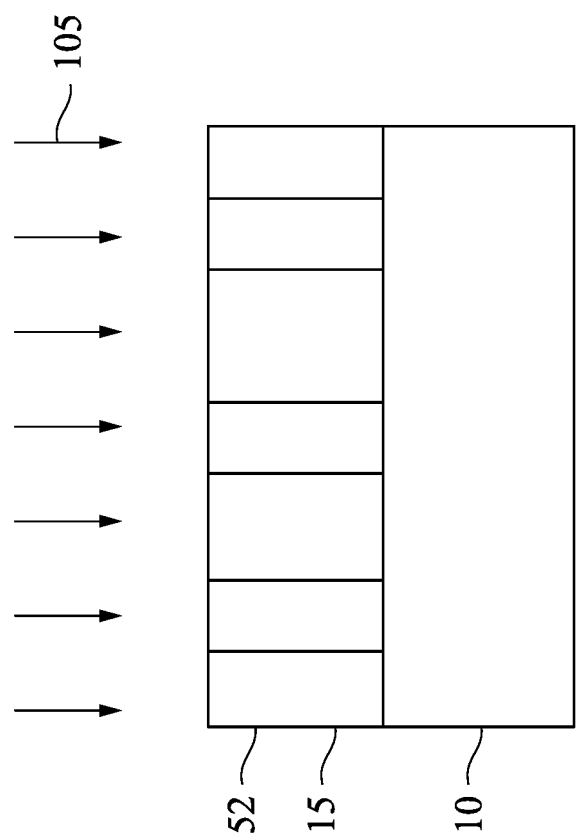

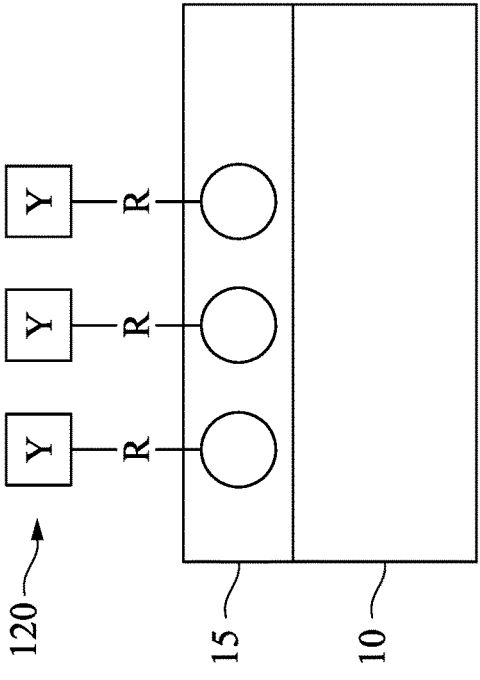
FIG. 19A
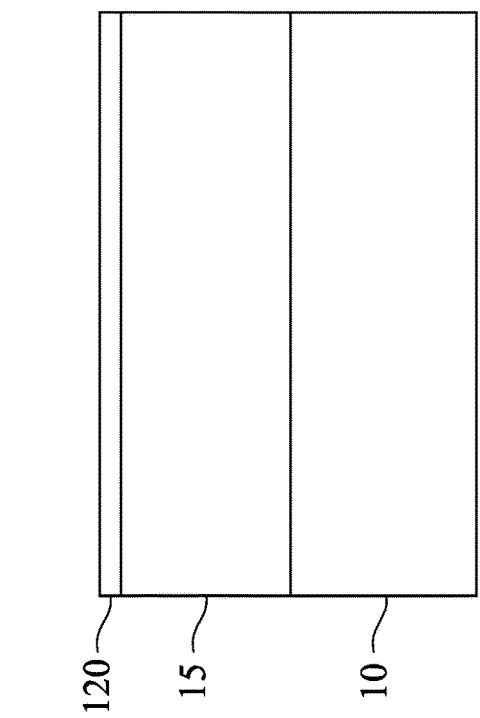
FIG. 19B
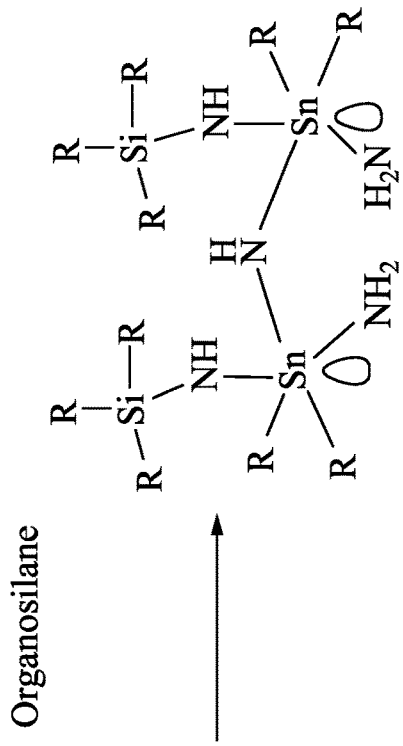
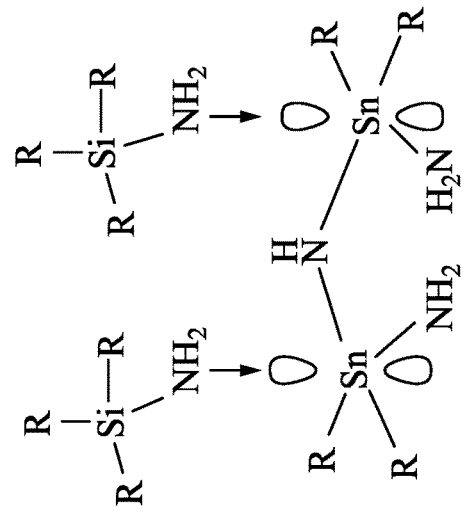
FIG. 19C

METHOD OF MANUFACTURING A SEMICONDUCTOR DEVICE

RELATED APPLICATIONS

This application claims priority to U.S. Provisional Patent Application No. 63/002,247 filed Mar. 30, 2020, and U.S. Provisional Patent Application No. 63/025,957 filed May 15, 2020, the entire contents of each are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A and 4B show a process stage of a sequential operation according to an embodiment of the disclosure.

FIG. 19A shows a process stage of a sequential operation according to an embodiment of the disclosure. FIG. 19B shows a detailed view of FIG. 19A. FIG. 19C shows a reaction the organometallic precursor undergoes.

DETAILED DESCRIPTION

Figure 1:
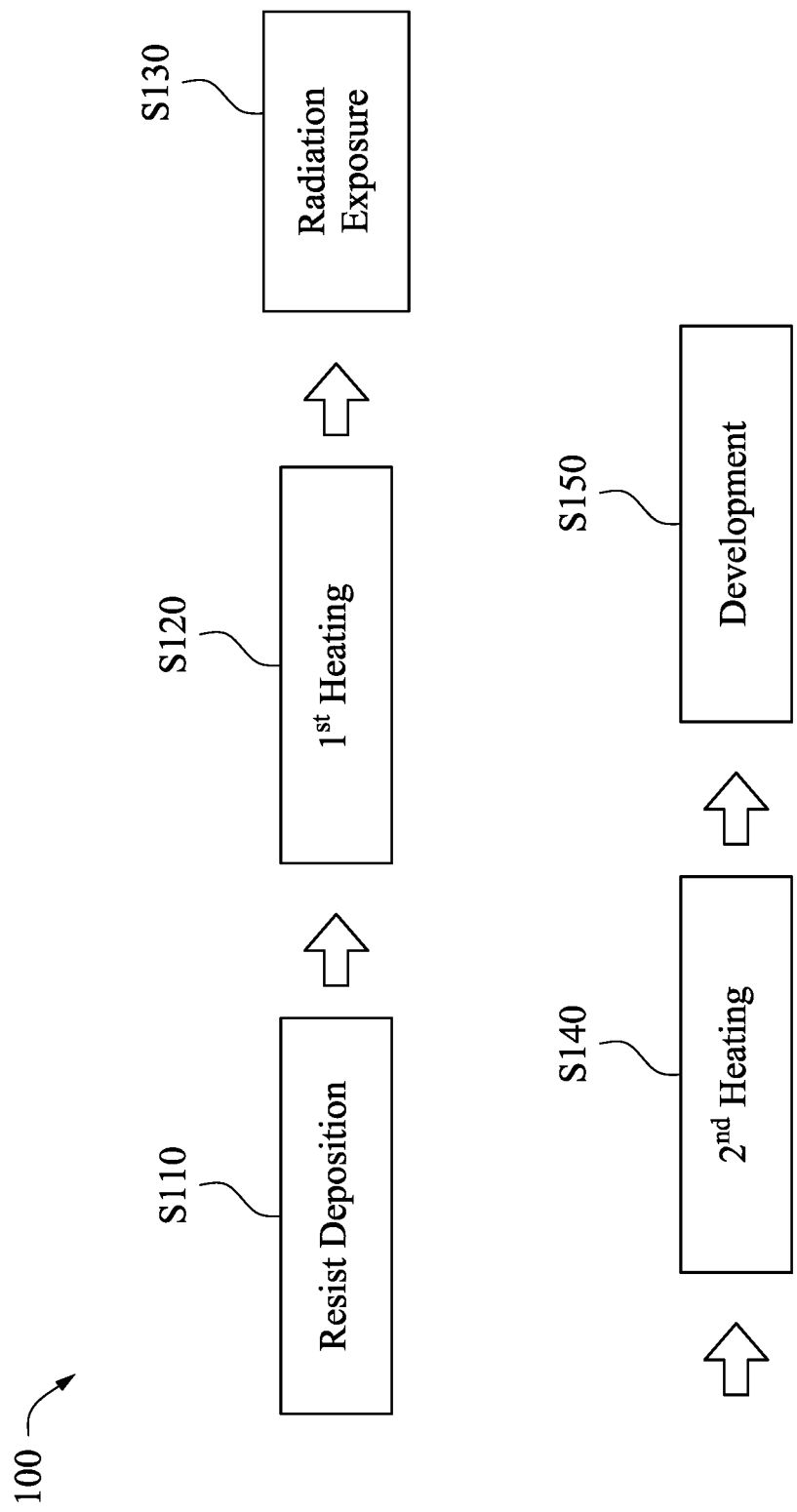
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity).

Metal-containing photoresists are used in extreme ultraviolet (EUV) lithography because metals have a high absorption capacity of extreme ultraviolet radiation and thus increase the resist photospeed. Metal-containing photoresist layers, however, may outgas during processing which can cause the photoresist layer quality to change over time and may cause contamination, thereby negatively affecting lithography performance, and increasing defects.

Furthermore, uneven exposure of the photoresist, especially at deeper portions of the photoresist layer may result in an uneven degree of cross-linking of the photoresist. Uneven exposure results from a lower amount of light energy reaching the lower portions of the photoresist layer. The uneven exposure may result in poor line width roughness (LWR) thereby preventing the formation of a straight edge resist profile.

Further, because the solvents used in the formation of and developing solvent-based photoresists may be toxic. A greener process of photoresist layer formation and subsequent pattern formation without using toxic solvents is desirable.

Moreover, a spin coating processes may use only 2-5% of the material dispensed onto the substrate, while the remaining 95-98% is flung off during the spin-coating operation. A photoresist deposition operation with high material use efficiency is desirable.

Furthermore, the density of spin-coated photoresist films may not be uniform. Aggregation of the photoresist film may occur in some portions.

In addition, photoresist layer formation and patterning operations that substantially reduce or prevent metal contamination of the processing chambers and substrate handling equipment from the metals in metal-containing photoresists is desirable.

In embodiments of the disclosure, the above issues are addressed by depositing a photoresist on a substrate by a vapor deposition operation, including atomic layer deposition (ALD) or chemical vapor deposition (CVD) of the photoresist material. Photoresist layers deposited by a vapor phase deposition operation according to embodiments of the disclosure provide photoresist layers that have controllable film thickness, and high film uniformity and density, over a large deposition area. In addition, embodiments of the disclosure include solvent free photoresist layer formation, thus providing a greener process. Moreover, the photoresist deposition operation is a one-pot method (carried out in a single chamber), thus increasing the manufacturing efficiency, and limiting or preventing metal contamination of processing chambers.

Figure 2:
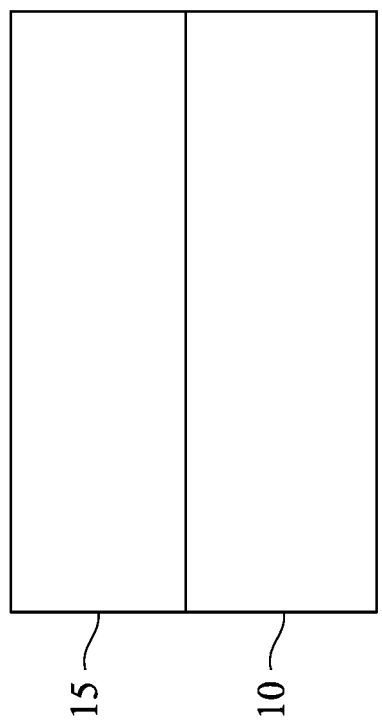
FIG. 2 shows a process stage of a sequential operation according to an embodiment of the disclosure.

FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. In some embodiments, the resist is a metal-containing photoresist formed by CVD or ALD. In some embodiments, the resist layer 15 then undergoes a first heating operation S120 after being deposited. In some embodiments, the resist layer is heated to a temperature of between about 40° C. and about 120° C. for about 10 seconds to about 10 minutes.

After the optional first heating operation S120 or the resist deposition operation S110, the photoresist layer 15 is selectively exposed to actinic radiation 45/97 (see FIGS. 3A and 3B) in operation S130. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the photoresist layer is selectively or patternwise exposed to an electron beam.

Figure 3A:
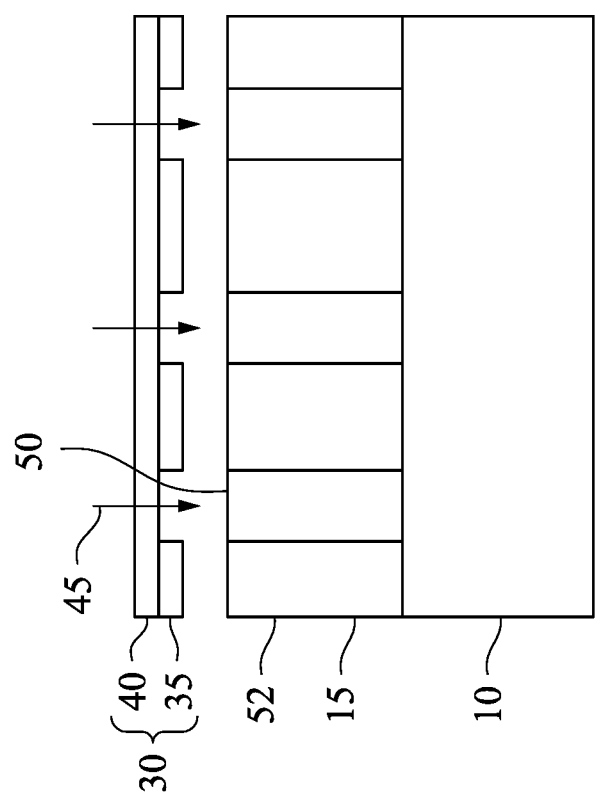
FIGS. 3A and 3B show a process stage of a sequential operation according to an embodiment of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
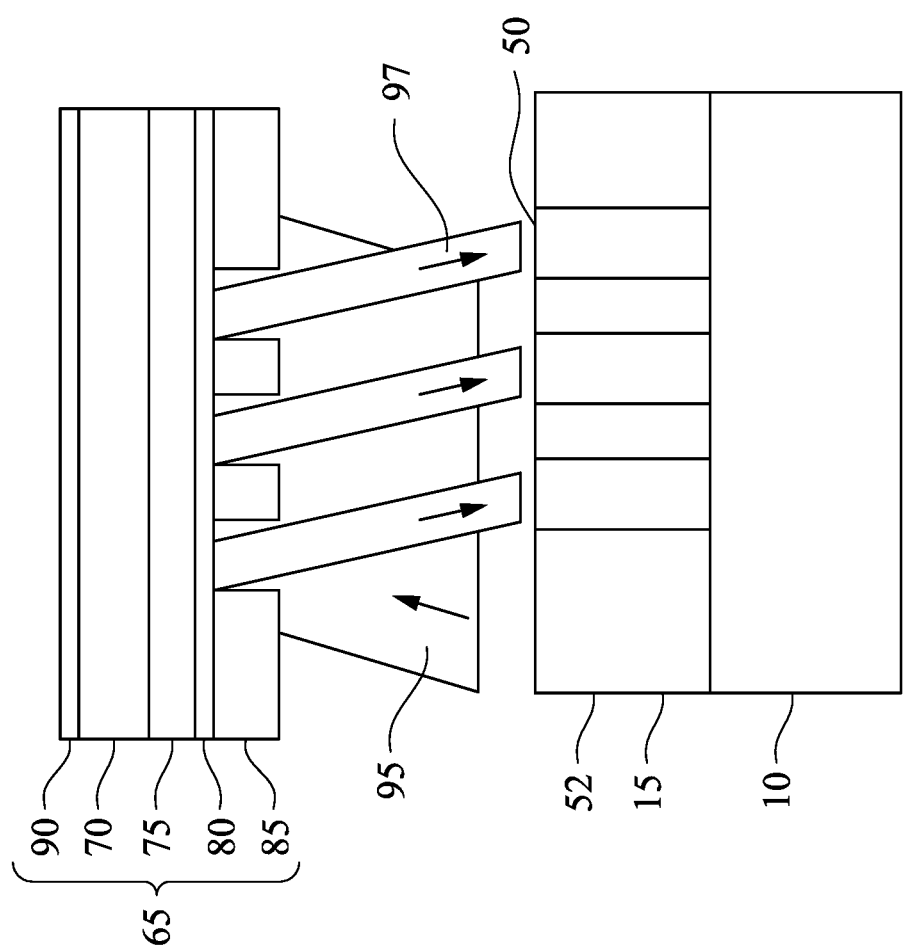

In some embodiments, the selective or patternwise exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are located between the reflective photomask 65 and the photoresist-coated substrate.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), and a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 mJ/cm² to about 150 mJ/cm² in some embodiments, from about 2 mJ/cm² to about 100 mJ/cm² in other embodiments, and from about 3 mJ/cm² to about 50 mJ/cm² in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 µC/cm² to about 5 µC/cm² in some embodiments, from about 0.5 µC/cm² to about 1 µC/cm² in other embodiments, and in other embodiments from about 1 µC/cm² to about 100 µC/cm². A person of ordinary skill in the art can compute corresponding doses at other beam energies based on the teachings herein and will recognize that additional ranges of electron beam properties within the explicit ranges above are contemplated and are within the present disclosure.

The region of the photoresist layer exposed to radiation 50 undergoes a chemical reaction thereby changing its susceptibility to being removed in a subsequent development operation S150. In some embodiments, the portion of the photoresist layer exposed to radiation 50 undergoes a reaction making the exposed portion more easily removed during the development operation S150. In other embodiments, the portion of the photoresist layer exposed to radiation 50 undergoes a reaction making the exposed portion resistant to removal during the development operation S150.

Next, the photoresist layer 15 undergoes a second heating or a post-exposure bake (PEB) in operation S140. In some embodiments, the photoresist layer 15 is heated to a temperature of about 50° C. to about 250° C. for about 20 seconds to about 120 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S140 causes the reaction product of the first compound or first precursor and the second compound or second precursor to crosslink.

Figure 5:
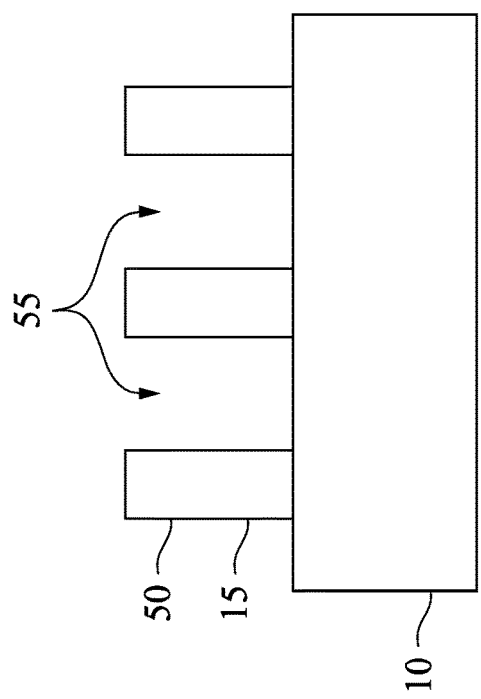
FIG. 5 shows a process stage of a sequential operation according to an embodiment of the disclosure.

The selectively exposed photoresist layer is subsequently developed in operation S150. In some embodiments, the photoresist layer 15 is developed by applying a solvent-based developer 57 to the selectively exposed photoresist layer. As shown in FIG. 4A, a liquid developer 57 is supplied from a dispenser 62 to the photoresist layer 15. In some embodiments, the exposed portions 50 of the photoresist undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 10, as shown in FIG. 5.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4A. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

In some embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, a dry developer 105 is applied to the selectively exposed photoresist layer 15, as shown in FIG. 4B. In some embodiments, the dry developer 105 is a plasma or chemical vapor, and the dry development operation S150 is a plasma etching or chemical etching operation. The dry development uses the differences related to the composition, extent of cross-linking, and film density to selectively remove the desired portions of the resist. In some embodiments, the dry development processes uses either a gentle plasma (high pressure, low power) or a thermal process in a heated vacuum chamber while flowing a dry development chemistry, such as $BCl_3$, $BF_3$, or other Lewis Acid in the vapor state. In some embodiments, the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure of ranging from about 5 mTorr to about 20 mTorr, at a power level from about 250 W to about 1000 W, temperature ranging from about 0° C. to about 300° C., and at flow rate of about 100 to about 1000 sccm, for about 1 to about 3000 seconds.

After the development operation, additional processing is performed while the patterned photoresist layer 50 is in place. For example, an etching operation, using dry or wet etching, is performed in some embodiments, to transfer the pattern of the photoresist layer 50 to the underlying substrate

Figure 6:
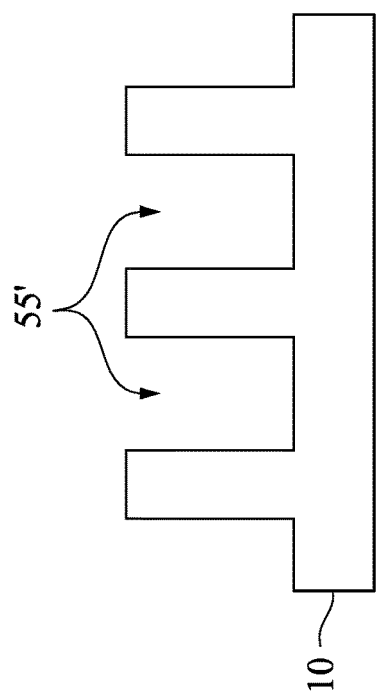
FIG. 6 shows a process stage of a sequential operation according to an embodiment of the disclosure.

10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the exposed photoresist layer 15 is at least partially removed during the etching operation. In other embodiments, the exposed photoresist layer 15 is removed after etching the substrate 10 by selective etching, using a suitable photoresist stripper solvent, or by a photoresist plasma ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal-nitride/sulfide/oxide/silicide having the formula $MX_a$, where M is a metal and X is N, S, Se, O, or Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when developed, the portions of the photoresist layer exposed to actinic radiation, such as UV light, are removed, while the region of the photoresist that is non-exposed (or exposed less) remains on the substrate after the development operation. A negative tone resist, on the other hand, refers to a photoresist material that when developed, the portions of the photoresist exposed to actinic radiation remain on the substrate after the development operation, while the region of the photoresist that is non-exposed (or exposed less) is removed during the development operation.

Figure 7:
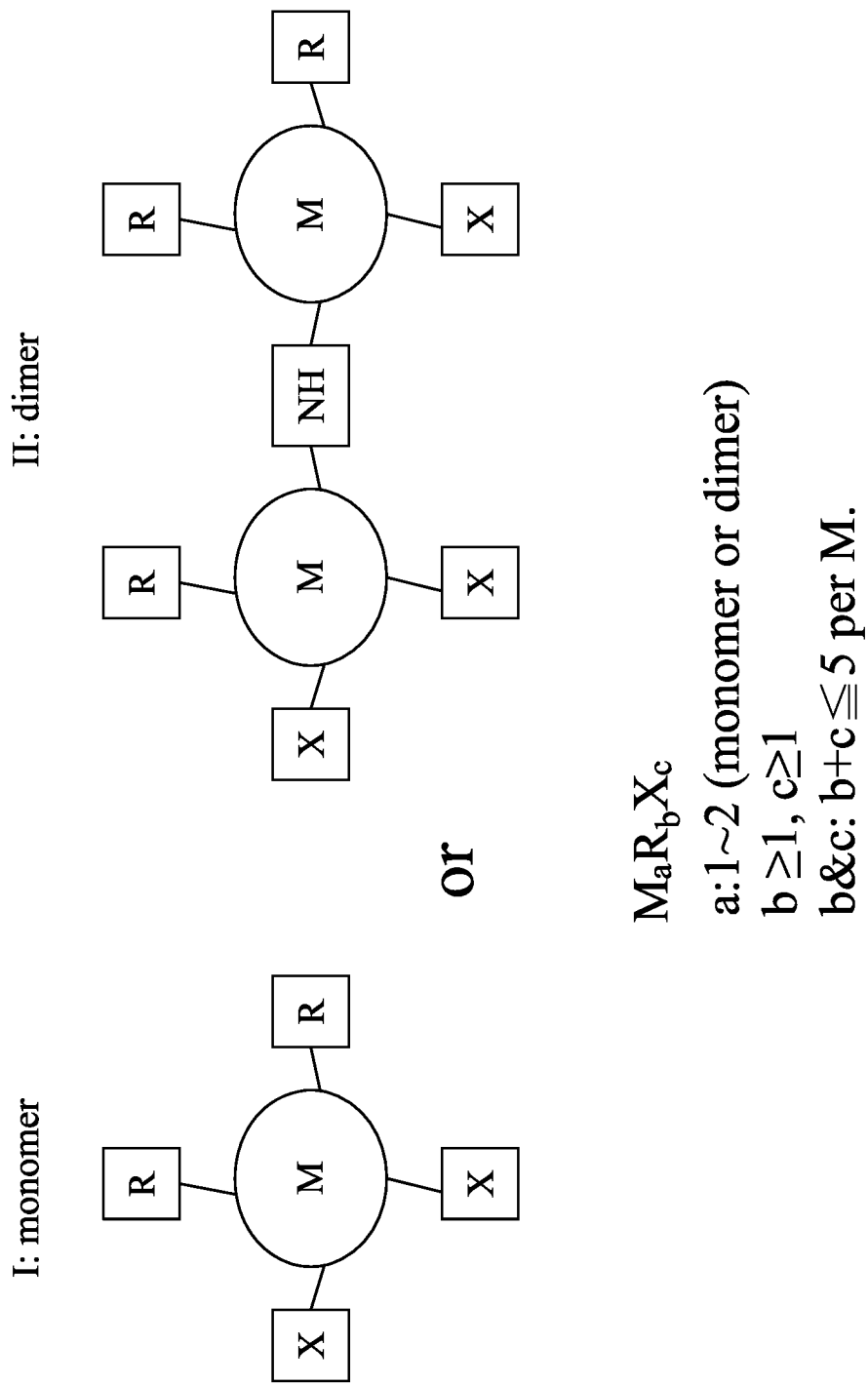
FIG. 7 shows organometallic precursors according to embodiments of the disclosure.

In some embodiments, the photoresist layer 15 is made of a photoresist composition, including a first compound or a first precursor and a second compound or a second precursor combined in a vapor state. The first precursor or first compound is an organometallic having a formula: $M_aR_bX_c$, as shown in FIG. 7, where M is selected from the group consisting of Sn, Bi, Sb, In, Te, Ti, Zr, Hf, V, Co, Mo, W, Al, Ga, Si, Ge, P, As, Y, La, Ce, Lu, and combinations thereof; and R is a substituted or unsubstituted alkyl, alkenyl, or carboxylate group. In some embodiments, M is selected from the group consisting of Sn, Bi, Sb, In, and Te. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \leq a \leq 2$, $b \geq 1$, $c \geq 1$, and $b+c \leq 5$ in some embodiments. In some embodiments, the alkyl, alkenyl, or carboxylate group is substituted with one or more fluoro groups. In some embodiments, the organometallic precursor is a dimer, as shown in FIG. 7, where each monomer unit is linked by an amine group. Each monomer has a formula: $M_aR_bX_c$, as defined above.

In some embodiments, R is alkyl, such as $C_nH_{2n+1}$ where $n \geq 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monoalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

In some embodiments, the organometallic precursor or organometallic compound include a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is one or more selected from the group consisting of an amine, a borane, and a phosphine. In some embodiments, the amine has a formula $N_pH_nX_m$, where $0 \leq n \leq 3$, $0 \leq m \leq 3$, n+m=3 when p is 1, and n+m=4 when p is 2, and each X is independently halogen selected from the group consisting of F, Cl, Br, and I. In some embodiments, the borane has a formula $B_pH_nX_m$, where $0 \leq n \leq 3$, $0 \leq m \leq 3$, n+m=3 when p is 1, and n+m=4 when p is 2, and each X is independently halogen selected from the group consisting of F, Cl, Br, and I. In some embodiments, the phosphine has a formula $P_pH_nX_m$, where $0 \leq n \leq 3$, $0 \leq m \leq 3$, n+m=3, when p is 1, or n+m=4 when p is 2, and each X is independently halogen selected from the group consisting of F, Cl, Br, and I.

In some embodiments, the second precursor or compound is ammonia or hydrazine. The reaction product of the ammonia or hydrazine and the organometallic precursor or compound may form hydrogen bonds that increase the boiling point of the reaction product and prevent emission of the metal photoresist material, thereby preventing metal contamination. The hydrogen bonds can also help prevent moisture effects to the photoresist layer quality.

In some embodiments, the operation S110 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD). The depositing a photoresist layer includes combining the first compound or first precursor and the second compound or second precursor in a vapor state to form the photoresist composition. In some embodiments, the first compound or first precursor and the second compound or second precursor of the photoresist composition are introduced into the deposition chamber (CVD chamber) at about the same time. In some embodiments, the first compound or first precursor and second compound or second precursor are introduced into the deposition chamber (ALD chamber) in an alternating manner, i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths, of an organometallic precursor and a second precursor are introduced to the deposition chamber of a CVD apparatus, where they mix and react in the gas phase, to form a reaction product. The streams are introduced using separate injection inlets or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate.

In some embodiments, an ALD process is used to deposit the photoresist layer. During ALD, a layer is grown on a substrate by exposing the surface of the substrate to alternate gaseous compounds (or precursors). In contrast to CVD, the precursors are introduced as a series of sequential, non-overlapping pulses. In each of these pulses the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer 15 is achieved.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layer. The photoresist layer thickness are relatively uniform to facilitate processing. In some embodiments, the variation in thickness of the coating varies by no more than ±25% from the average coating thickness, in other embodiments the photoresist layer thickness varies by no more than ±10% from the average photoresist layer thickness. In some embodiments, such as high uniformity coatings on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber with a carrier gas. The carrier gas, a purge gas, a deposition gas, or other process gas may contain nitrogen, hydrogen, argon, neon, helium, or combinations thereof.

Figure 8:
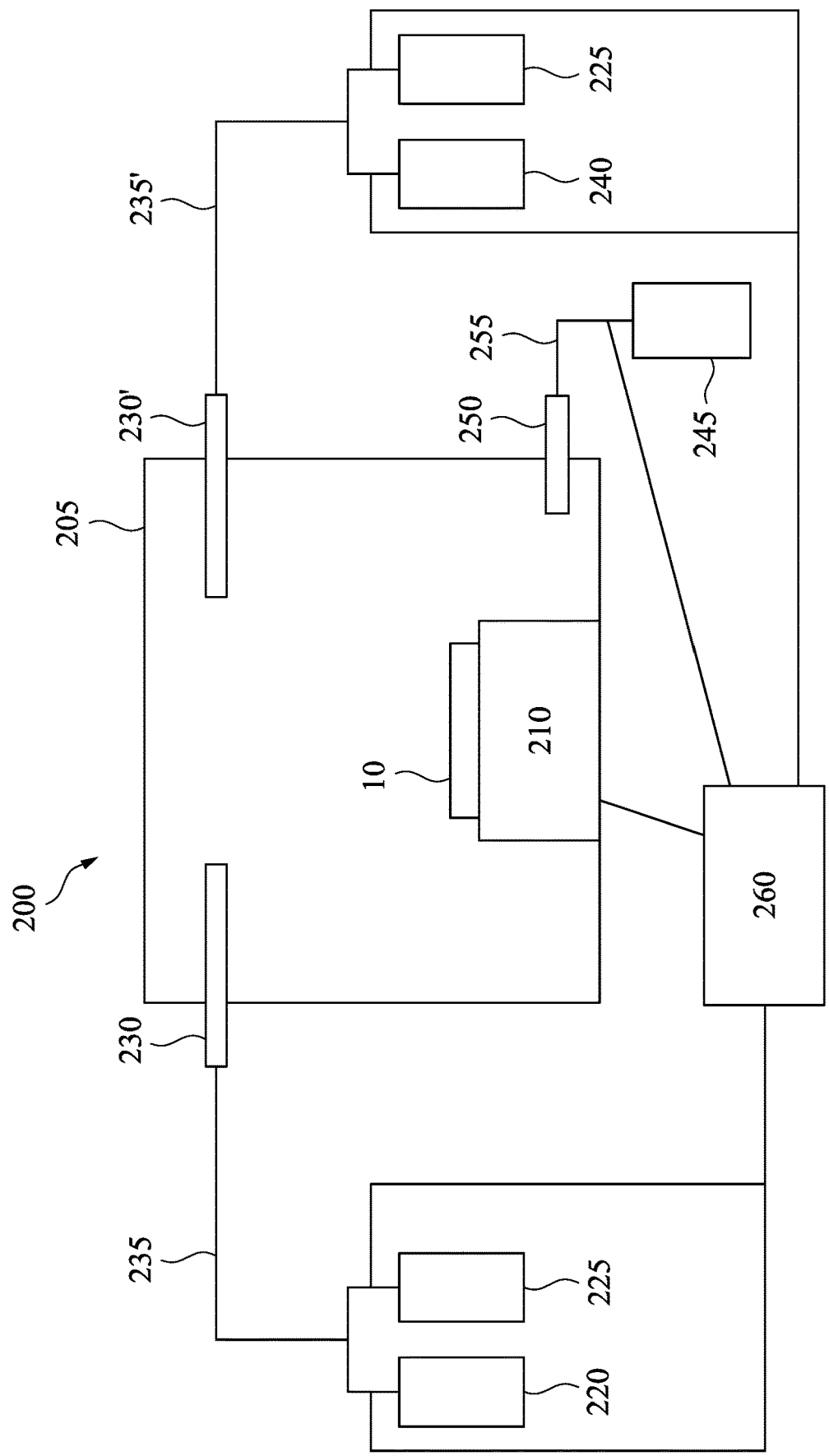
FIG. 8 shows a photoresist deposition apparatus according to some embodiments of the disclosure.

A resist layer deposition apparatus 200 according to some embodiments of the disclosure is shown in FIG. 8. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

In some embodiments, the ALD or CVD deposition parameters are varied during the deposition operation to form a photoresist layer having a density gradient. In some embodiments, the density gradient photoresist layer reduces defects, such as scum and bridging; and improves the line width roughness (LWR) and line edge roughness (LER).

Figure 9:
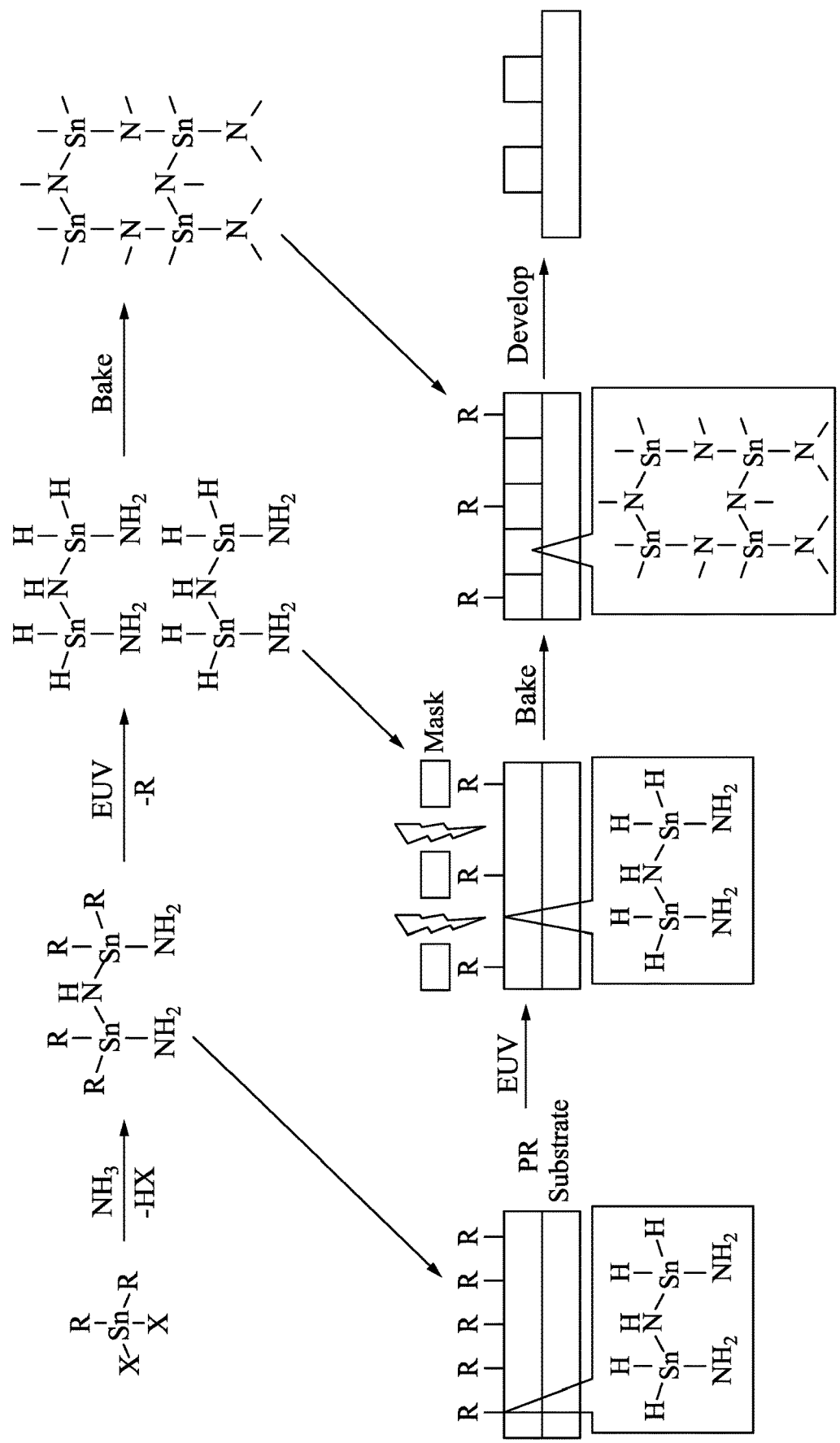
FIG. 9 shows a reaction the photoresist layer undergoes as a result of exposure to actinic radiation and heating according to an embodiment of the disclosure.

FIG. 9 shows a reaction the photoresist composition components undergo as a result of exposure to actinic radiation and heating according to an embodiment of the disclosure. FIG. 9 shows an exemplary chemical structure of the photoresist layer (PR) at various stages of the photoresist patterning method according to embodiments of the disclosure. As shown in FIG. 9, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and prevent the outgassing of metal-containing photoresist material, thereby preventing contamination of the deposition chamber and semiconductor device processing equipment by the metal in the metal-containing photoresist. Moreover, the hydrogen bonds of the amine groups can control the effect moisture has on photoresist layer quality.

When subsequently exposed to extreme ultraviolet radiation using a mask, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 9. In some embodiments, partial crosslinking of the amino metallic compounds occurs as a result of the exposure to extreme ultraviolet radiation. The selectively exposed photoresist is subsequently developed, and the crosslinked radiation exposed pattern remains over the substrate while the radiation unexposed areas are removed during the development.

Figure 10:
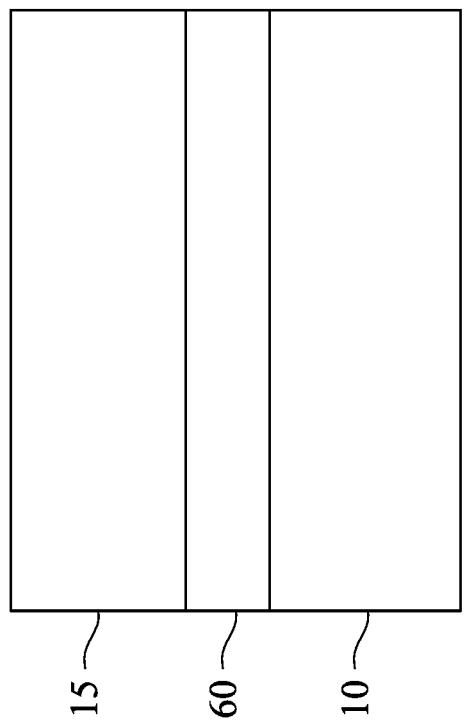
FIG. 10 shows a process stage of a sequential operation according to an embodiment of the disclosure.

In some embodiments, a layer to be patterned (target layer) 60 is disposed over the substrate prior to forming the photoresist layer, as shown in FIG. 10. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 11A:
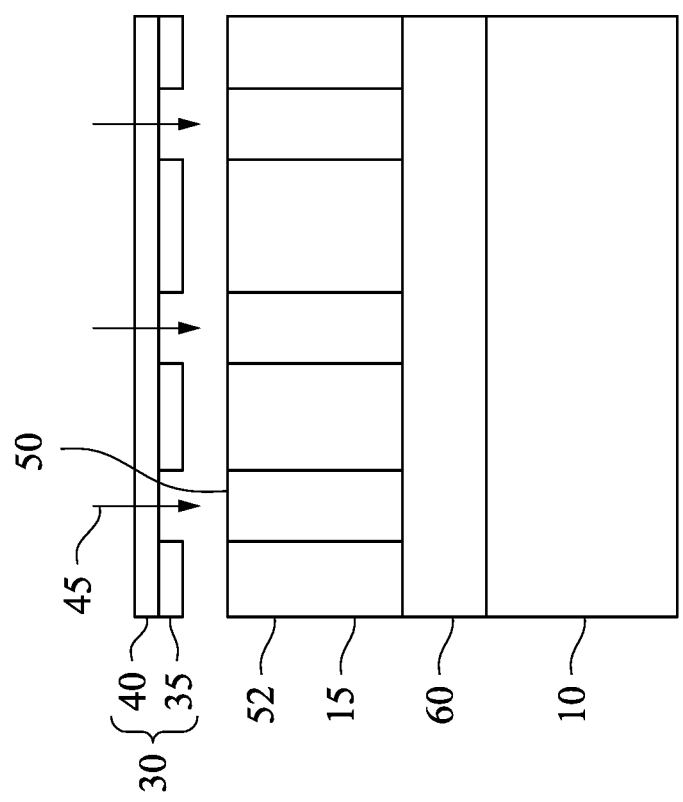
FIGS. 11A and 11B show a process stage of a sequential operation according to an embodiment of the disclosure.
Figure 11B:
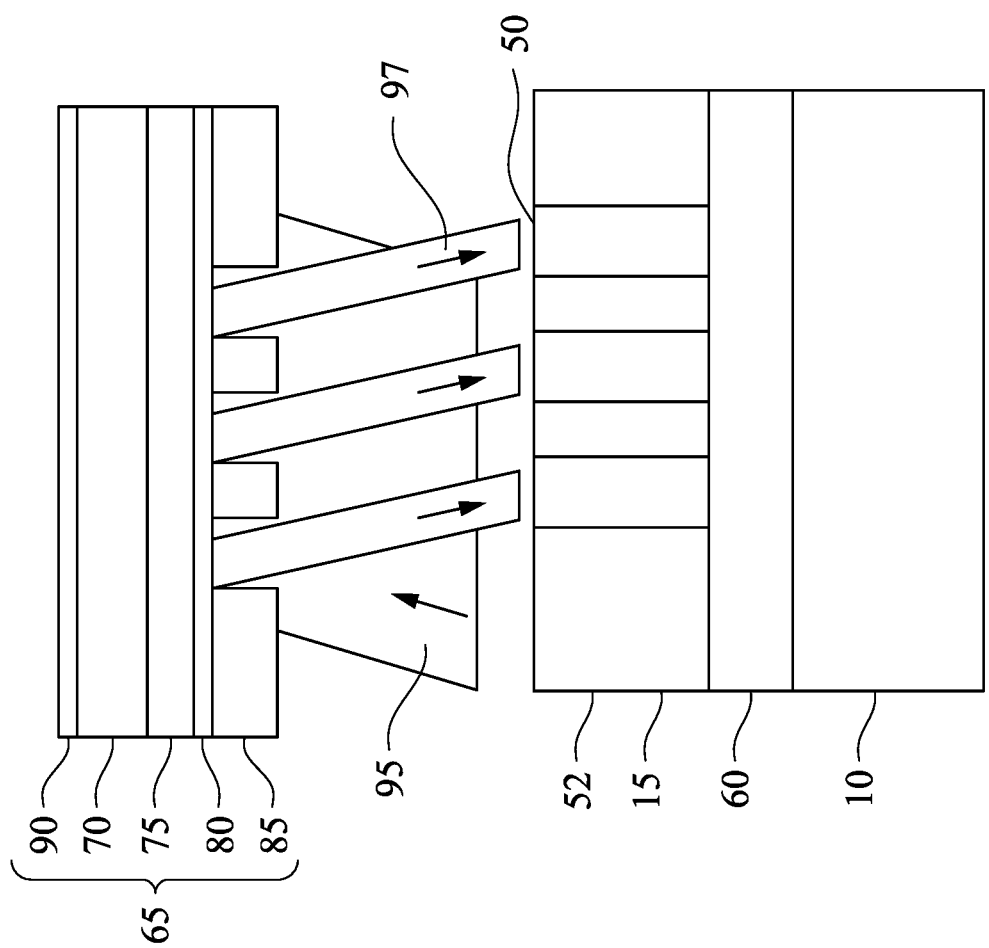

The photoresist layer 15 is subsequently selectively exposed to actinic radiation 45 to form exposed regions 50 and unexposed regions 52 in the photoresist layer, as shown in FIGS. 11A and 11B, and described herein in relation to FIGS. 3A and 3B. As explained herein the photoresist is a negative-tone photoresist in some embodiments.

Figure 12A:
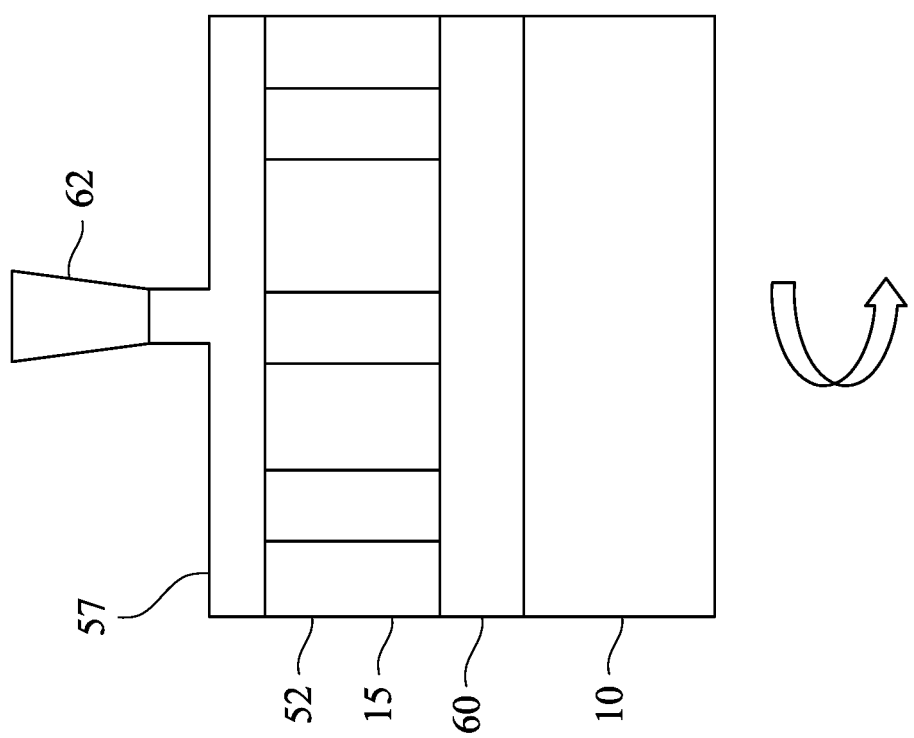
FIGS. 12A and 12B show a process stage of a sequential operation according to an embodiment of the disclosure.
Figure 12B:
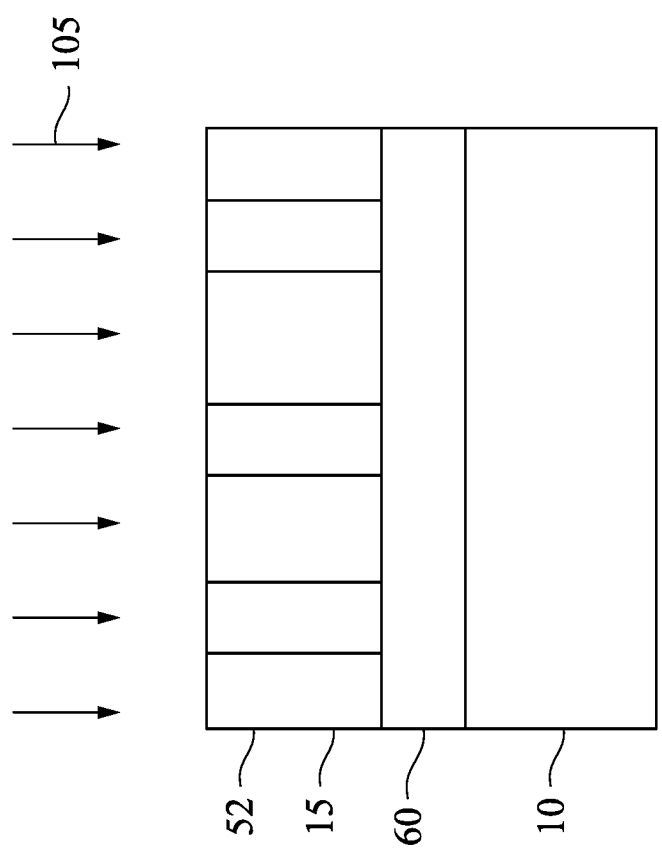
Figure 13:
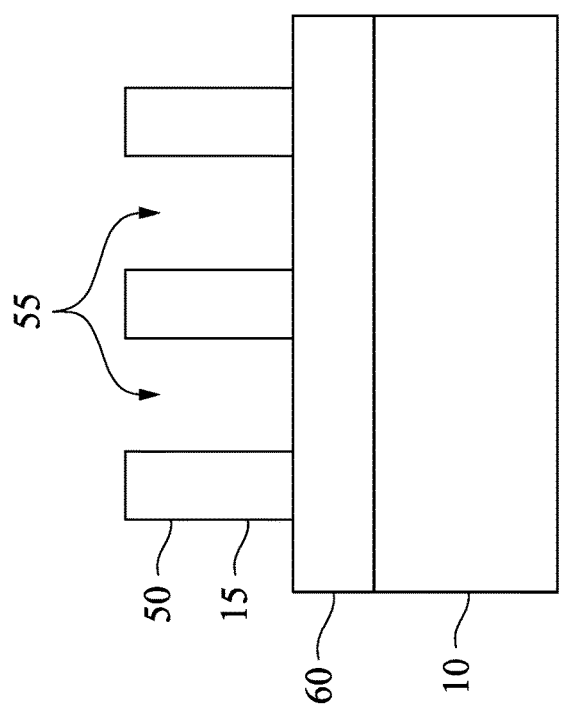
FIG. 13 shows a process stage of a sequential operation according to an embodiment of the disclosure.

The unexposed photoresist regions 52 are developed by dispensing developer 57 from a dispenser 62, as shown in FIG. 12A, or by a dry development operation, as shown in FIG. 12B to form a photoresist pattern 55, as shown in FIG. 13. The development operation is similar to that explained herein with reference to FIGS. 4A, 4B, and 5.

Figure 14:
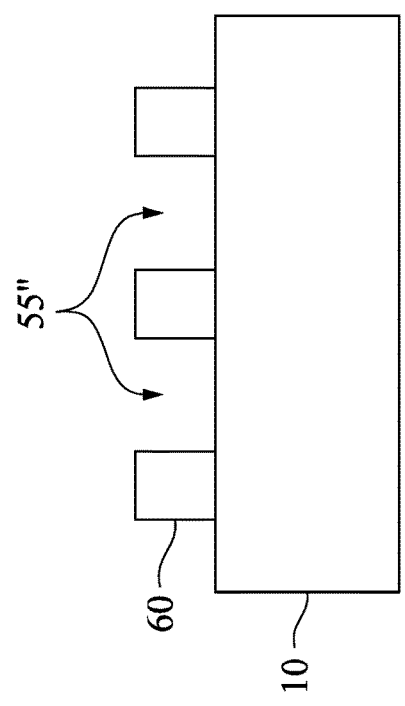
FIG. 14 shows a process stage of a sequential operation according to an embodiment of the disclosure.

Then as shown in FIG. 14, the pattern 55 in the photoresist layer 15 is transferred to the layer to be patterned 60 using an etching operation and the photoresist layer is removed, as explained with reference to FIG. 6 to form pattern 55" in the layer to be patterned 60.

Figure 15:
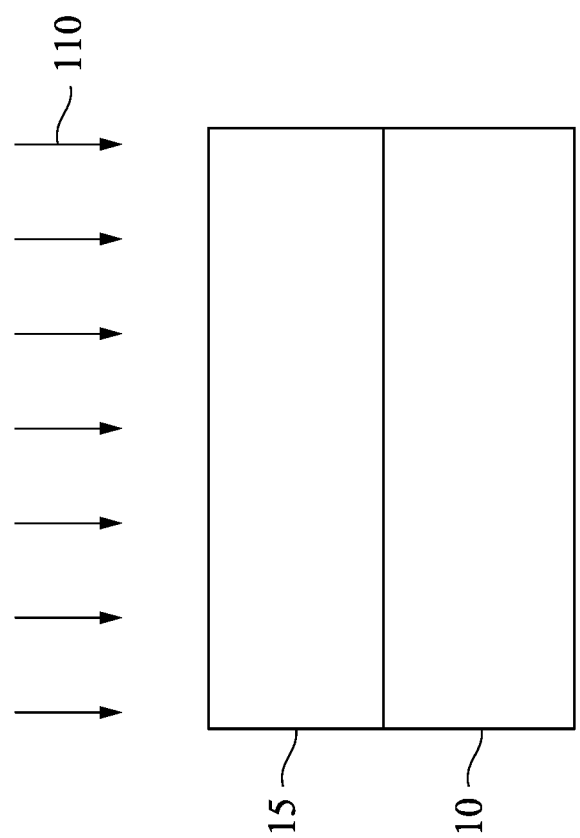
FIG. 15 shows a process stage of a sequential operation according to an embodiment of the disclosure.

In some embodiments, the photoresist layer 15 is exposed to infrared, visible, or near-ultraviolet radiation 110 before selectively or patternwise exposing the photoresist layer to reduce or inhibit outgassing of the photoresist layer, as shown in FIG. 15. The exposure to infrared, visible, or near ultraviolet radiation is at a lower exposure dose than the subsequent patternwise exposure. The exposure to infrared, visible, or near ultraviolet radiation increases the density of the film in some embodiments, and reduces issues caused by moisture in some embodiments. In some embodiments, the photoresist layer is thermally treated prior to selective or patternwise exposure to increase the density of the photoresist layer. In some embodiments, the thermal treatment includes heating the photoresist layer to a temperature of about 40° C. and 120° C. for about 10 seconds to about 10 minutes. Then, the photoresist layer and substrate are processed as discussed herein in reference to FIGS. 3A-6 and FIGS. 11A-14.

Figure 16A:
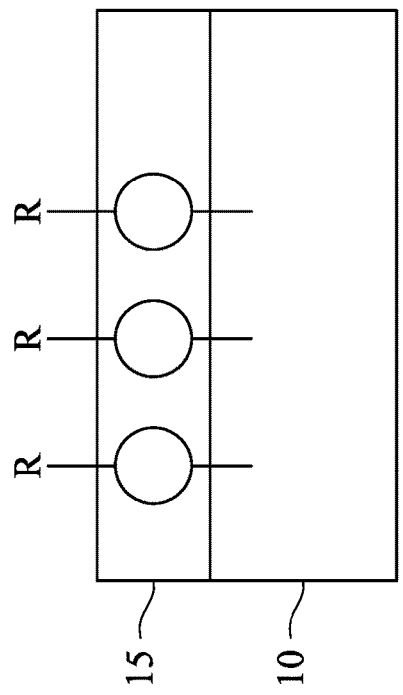
FIG. 16A shows a process stage of a sequential operation according to an embodiment of the disclosure.
Figure 16B:
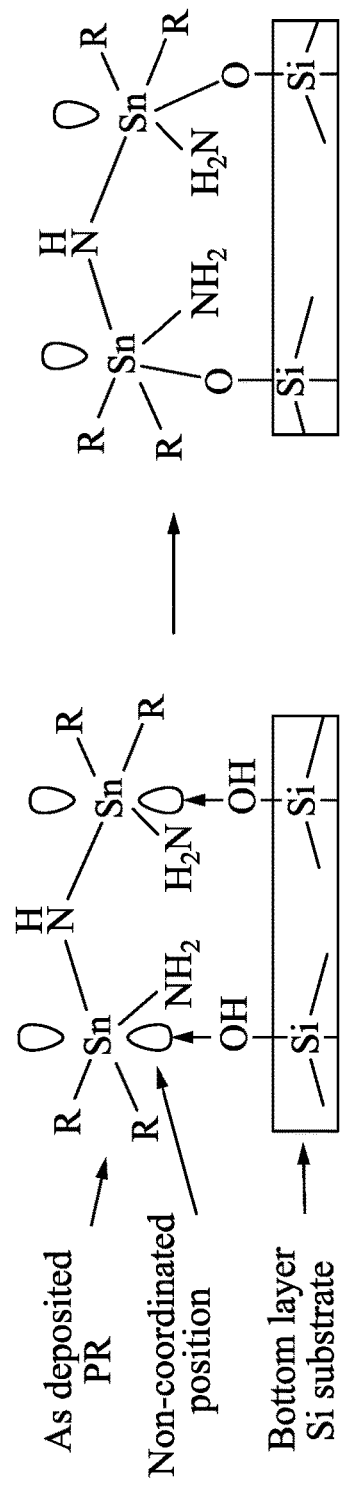
FIG. 16B shows a reaction the photoresist layer undergoes during the process stage.

In some embodiments, the photoresist layer 15 includes organometallic compounds or precursors that include one or more unsaturated bonds that can be coordinated with functional groups of an underlying substrate 10, as shown in FIG. 16A. As shown in FIG. 16B, the as deposited photoresist (PR) includes unsaturated bonds at an uncoordinated position. Upon heating the photoresist layer 15, functional groups, such as hydroxyl groups, on the surface of the substrate 10 or an intervening layer, react with the unsaturated bonds and chemically bond the photoresist layer 15 to the substrate 10 or intervening layer, thereby improving adhesion of the photoresist to the substrate. Then, the photoresist layer and substrate are processed as discussed herein in reference to FIGS. 3A-6 and FIGS. 11A-14. In some embodiments, the substrate is a silicon substrate, such as a silicon wafer, or a layer of silicon.

Figure 17:
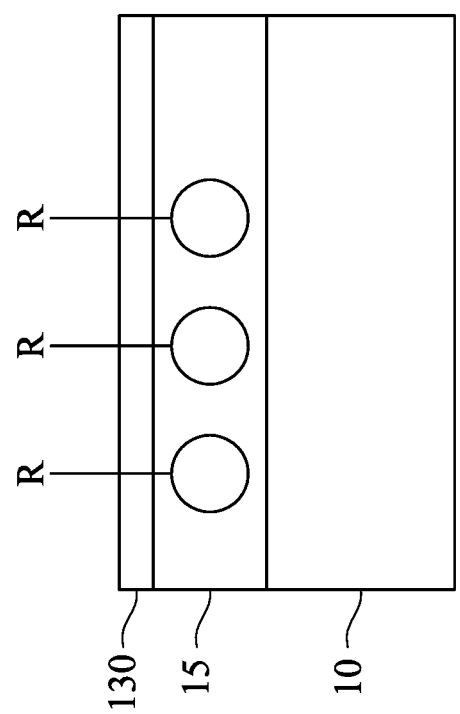
FIG. 17 shows a process stage of a sequential operation according to an embodiment of the disclosure.

In some embodiments, a cap layer 130 is applied to the resist layer before selectively or patternwise exposing the resist layer 15 or crosslinking the resist layer 15, as shown in FIG. 17. The cap layer 130 is a non-metallic layer, such as silicon oxide or silicon nitride in some embodiments, or a polymer layer in other embodiments. In some embodiments, the cap layer 130 is deposited by atomic layer deposition, chemical vapor deposition, or spin coating. In some embodiments, the cap layer 130 is deposited in the same chamber as the photoresist layer. In some embodiments, the cap layer 130 helps prevent outgassing of the resist or metal contamination. Moreover, the cap layer 130 can help prevent moisture from deleteriously affecting the photoresist layer. In some embodiments, the cap layer has a thickness ranging from about 0.5 nm to about 10 nm. In other embodiments, the thickness of the cap layer ranges from about 1 nm to about 5 nm. In some embodiments, thicknesses below 0.5 nm are too thin to effectively inhibit resist outgassing and moisture effects on the resist layer and thicknesses above 10 nm do not provide any additional benefit over thicknesses of 10 nm. Then, the photoresist layer and substrate are processed as discussed herein in reference to FIGS. 3A-6 and FIGS. 11A-14. The cap layer 130 is removed either before, during, or after the development operation in some embodiments. In some embodiments, the cap layer is removed before patternwise exposure.

Figure 18:
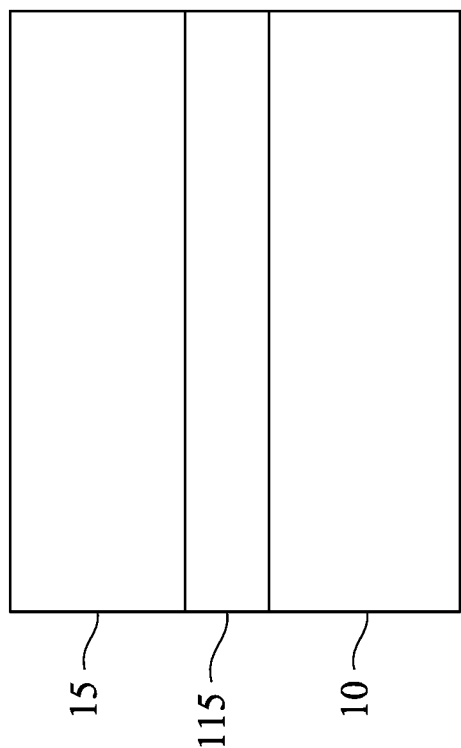
FIG. 18 shows a process stage of a sequential operation according to an embodiment of the disclosure.

In some embodiments, the surface of the substrate is treated with hexamethyldisilazane (HMDS) before the photoresist layer is formed over the substrate. In some embodiments, an amorphous carbon-containing underlayer 115 (or simply "underlayer") is formed over the substrate before forming the resist layer 15, as shown in FIG. 18. In some embodiments, the underlayer 115 reduces the deleterious effects of moisture, and in some embodiments, the underlayer 115 improves adhesion of the photoresist layer 15 to the substrate 10. In some embodiments, the amorphous carbon underlayer 115 is a carbon-based polymer layer. In some embodiments, the underlayer 115 is an amorphous carbon-containing layer formed by chemical vapor deposition. In some embodiments, the underlayer 115 is deposited by a variety of techniques, for example, by the plasma induced polymerization of unsaturated monomeric precursors such as ethylene, propylene, acetylene, or any other volatile hydrocarbon based precursor. In some embodiments the underlayer 115 has a thickness ranging from about 0.5 nm to about 10 nm. In other embodiments, the thickness of the underlayer 115 ranges from about 1 nm to about 5 nm. In some embodiments, the underlayer 115 improves adhesion of the photoresist layer 15 to the substrate 10 surface. In some embodiments, thicknesses below 0.5 nm are too thin to be effectively reduce the effects of moisture or improve photoresist adhesion to the substrate 10 and thicknesses above 10 nm do not provide any additional benefit over thicknesses of 10 nm. Then, the photoresist layer and substrate are processed as discussed herein in reference to FIGS. 3A-6 and FIGS. 11A-13. The exposed portions of the underlayer 115 is removed by etching in some embodiments.

In some embodiments, an organic silane is applied to the resist layer before selectively or patternwise exposing the resist layer 15 or crosslinking the resist layer 15 to form an organic silane layer 120, as shown in FIGS. 19A-19C. In some embodiments, the organic silane top layer helps prevent outgassing of the resist or metal contamination. Moreover, the top layer can help prevent the moisture from deleteriously affecting the photoresist layer. FIG. 19B is a detailed view of FIG. 19A showing the organic silane Y bonded to the organometallic precursor or compound in the resist layer 15. The organic silane Y can be any suitable organic silane. In some embodiments, the organic silane is one or more selected from the group consisting of trisilylamine, 1,3,5-trisilacyclohexane, 1,3,5-trisilapentane, bis(diethylamino)silane, bis(tertiarybutylamino)silane, dichlorosilane, dibromosilane, diiodosilane, and disilane. In some embodiments, the organic silane is deposited by atomic layer deposition or chemical vapor deposition. An example of a reaction between an organic silane and the resist layer is shown in FIG. 19C. The organic silane (organosilane) is deposited over the resist layer and the organic silane coordinates with organometallics in the resist layer. In some embodiments, the organic silane is deposited in the same chamber on the top surface of the photoresist layer. Then, the photoresist layer and substrate are processed as discussed herein in reference to FIGS. 3A-6 and FIGS. 11A-14. The organic silane layer 120 is removed during or after the development operation in some embodiments.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

Semiconductor formation methods and resist patterning methods according to the present disclosure provide improved resist material use efficiency and reduced use of potentially toxic organic solvents over solvent-based resists. Embodiments of the disclosure provide a uniform photoresist film deposited on the surface of a semiconductor substrate. Toxic organic solvents can be substantially eliminated from the photoresist patterning process because the photoresist is not solvent based, and dry development is performed without the use of a solvent-based developer in some embodiments. In some embodiments, contamination of the deposition chamber and semiconductor substrate handling equipment from metals in metal-containing photoresists is prevented. Photoresist moisture sensitivity issues are prevented by methods according to embodiments of the disclosure. Improved pattern resolution is provided by embodiments of the present disclosure. In addition, improved semiconductor device fabrication efficiency is provided by the one-pot deposition methods according to embodiments of the disclosure.

The dry patterning techniques disclosed herein may provide various benefits relative to wet pattern formation. For example, the dry deposition techniques described herein can be used to deposit thinner and more defect free films than can be applied using spin-coating techniques, and the exact thickness of the deposited film can be modulated and controlled by increasing or decreasing the length of the deposition step or sequence. Accordingly, a dry process may provide more tunability and give further critical dimension (CD) control and scum removal. Dry development can improve performance, by preventing line collapse due to surface tension in wet development) and enhance throughput by avoiding the wet development track. Embodiments of the disclosure provide improved line width roughness and improved distinction between exposed and unexposed portions of the photoresist.

An embodiment of the disclosure is a method of manufacturing a semiconductor device, including forming a photoresist layer over a substrate, including combining a first precursor and a second precursor in a vapor state to form a photoresist material, wherein the first precursor is an organometallic having a formula: $M_aR_bX_c$, where M is at least of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$. The second precursor is at least one of an amine, a borane, or a phosphine. The forming the photoresist includes depositing the photoresist material over the substrate. The photoresist layer is selectively exposed to actinic radiation to form a latent pattern, and the latent pattern is developed by applying a developer to the selectively exposed photoresist layer to form a pattern. In an embodiment, the actinic radiation is extreme ultraviolet radiation. In an embodiment, the method includes after selectively exposing the photoresist layer to actinic radiation to form a latent pattern and before developing the latent pattern, baking the photoresist layer. In an embodiment, the alkyl, alkenyl, or carboxylate group is substituted with one or more fluoro groups. In an embodiment, the sulfonate group is substituted with one or more amine groups. In an embodiment, the photoresist material is deposited over the substrate by atomic layer deposition (ALD) or chemical vapor deposition (CVD). In an embodiment, the method includes exposing the photoresist layer to infrared, visible, or near-ultraviolet radiation before selectively exposing the photoresist layer to actinic radiation. In an embodiment, the method includes forming an amorphous carbon-containing layer over the substrate before forming the photoresist layer. In an embodiment, the method includes forming a carbon-based polymer layer over the substrate before forming the photoresist layer. In an embodiment, the method includes applying an organic silane to the photoresist layer before selectively exposing the photoresist layer to actinic radiation. In an embodiment, the amine is ammonia or hydrazine. In an embodiment, the method includes forming a silicon oxide or silicon nitride over the photoresist layer before selectively exposing the photoresist layer.

Another embodiment of the disclosure is a method of manufacturing a semiconductor device, including depositing a photoresist composition having a first compound and a second compound over a substrate surface via atomic layer deposition (ALD) or chemical vapor deposition (CVD) to form a photoresist layer. The depositing a photoresist layer includes combining the first compound and the second compound in a vapor state to form the photoresist composition, wherein the first compound is at least one of a sec-hexyl tris(dimethylamino) tin, t-hexyl tris(dimethylamino) tin, i-hexyl tris(dimethylamino) tin, n-hexyl tris (dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris (dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris (t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris (butoxy) tin. The second compound is at least one of an amine, a borane, or a phosphine. The photoresist layer is selectively exposed to actinic radiation to form a latent pattern. The latent pattern is developed by applying a developer to the selectively exposed photoresist layer to form a pattern exposing a portion of the substrate surface. A portion of the substrate exposed by the developing is removed. In an embodiment, the removing a portion of the substrate by the developing includes etching the substrate. In an embodiment, the actinic radiation is extreme ultraviolet radiation. In an embodiment, the method includes after selectively exposing the photoresist layer to actinic radiation to form a latent pattern and before developing the latent pattern, heating the photoresist layer at a temperature ranging from 100° C. to 200° C. In an embodiment, the first compound is substituted with one or more fluoro groups. In an embodiment, the developer is a dry developer. In an embodiment, the method includes exposing the photoresist layer to infrared, visible, or near-ultraviolet radiation before selectively exposing the photoresist layer to actinic radiation. In an embodiment, the method includes forming amorphous carbon layer over the substrate before forming the photoresist layer. In an embodiment, the amorphous carbon layer is a polymer layer. In an embodiment, the method includes applying an organic silane to the photoresist layer before selectively exposing the photoresist layer to actinic radiation. In an embodiment, the amine is ammonia or hydrazine. In an embodiment, the method includes forming a silicon oxide or silicon nitride over the photoresist layer before selectively exposing the photoresist layer.

Another embodiment of the disclosure is a method of manufacturing a semiconductor device including introducing a first compound and a second compound into a chamber at a same time to form composition of the first compound and the second compound. The composition of the first compound and the second compound is deposited over a substrate via chemical vapor deposition (CVD) to form a layer of the composition. The first compound is an organometallic compound and the second compound is selected from the group consisting of an amine, a borane, a phosphine, and combinations thereof. The layer of the composition is patternwise exposed to actinic radiation to form a latent pattern, and the patternwise exposed layer of the composition is developed to form a patterned layer of the composition. In an embodiment, the amine, borane, or phosphine includes a halide substituent. In an embodiment, the method includes exposing the layer of the composition to infrared, visible, or near-ultraviolet radiation before patternwise exposing the layer of the composition to actinic radiation. In an embodiment, the method includes forming a polymer layer over the substrate before depositing the composition. In an embodiment, the method includes applying an organic silane to the layer of the composition before selectively exposing the layer of the composition to actinic radiation. In an embodiment, the actinic radiation is extreme ultraviolet radiation. In an embodiment, the method includes after patternwise exposing the layer of the composition to actinic radiation to form a latent pattern and before developing the latent pattern, heating the layer of the composition at a temperature ranging from 100° C. to 200° C. In an embodiment, the method includes removing an exposed portion of the substrate after the developing. In an embodiment, the removing a portion of the substrate by the developing includes etching the substrate. In an embodiment, the developing is a dry developing operation. In an embodiment, the amine is ammonia or hydrazine. In an embodiment, the method includes forming a silicon oxide or silicon nitride over the layer of the composition before selectively exposing the layer of the composition.

Another embodiment of the disclosure is a method of patterning a resist layer, including depositing a resist layer over a substrate surface by atomic layer deposition (ALD) or chemical vapor deposition (CVD). The resist layer comprises a reaction product of an organometallic compound that does not include silicon and a compound selected from the group consisting of an amine, a borane, and a phosphine. The resist layer is patternwise crosslinked to form a latent pattern in the resist layer. The latent pattern is developed by applying a developer to the patternwise crosslinked resist layer to form a pattern exposing a portion of the substrate surface. In an embodiment, the method includes removing a portion of the substrate exposed by the developing. In an embodiment, the organometallic compound includes a metal selected from the group consisting of Sn, Bi, Sb, In, and Te. In an embodiment, the organometallic compound includes a substituted or unsubstituted alkyl, alkenyl, or carboxylate group. In an embodiment, the organometallic compound includes a halide or sulfonate group. In an embodiment, the sulfonate group is substituted with one or more amine groups. In an embodiment, the amine, borane, or phosphine includes a halide substituent. In an embodiment, the patternwise crosslinking the resist layer includes patternwise exposing the resist layer to extreme ultraviolet radiation, and heating the patternwise exposed resist layer. In an embodiment, the patternwise exposed resist layer is heated at a temperature ranging from 100° C. to 200° C. In an embodiment, the method includes exposing the resist layer to infrared, visible, or near-ultraviolet radiation before patternwise crosslinking the resist layer. In an embodiment, the amine is ammonia or hydrazine. In an embodiment, the method includes forming a silicon oxide or silicon nitride over the resist layer before patternwise crosslinking the photoresist layer.

Another embodiment of the disclosure is a method of forming a patterned layer over a substrate surface, including depositing a reaction product of a vapor phase organometallic compound and a second vapor phase compound over a substrate to form a resist layer. The organometallic compound has a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$; and the second vapor phase compound is selected from the group consisting of an amine, a borane, a phosphine, and combinations thereof. The resist layer is patternwise crosslinked to form a latent pattern in the resist layer. The latent pattern is developed by applying a developer to the patternwise crosslinked resist layer to form a pattern exposing a portion of the substrate surface. In an embodiment, X is a sulfonate group substituted with one or more amine groups. In an embodiment, the amine, borane, or phosphine includes a halide substituent. In an embodiment, the patternwise crosslinking the resist layer includes patternwise exposing the resist layer to extreme ultraviolet radiation, and heating the patternwise exposed resist layer. In an embodiment, the patternwise crosslinked resist layer is heated at a temperature ranging from 100° C. to 200° C. In an embodiment, the method includes removing a portion of the substrate exposed by the developing. In an embodiment, the method includes heating the resist layer at a temperature ranging from 40° C. to 120° C. before patternwise crosslinking the resist layer. In an embodiment, the method includes forming amorphous carbon layer over the substrate before forming the resist layer. In an embodiment, the amorphous carbon layer is a polymer layer. In an embodiment, the method includes applying an organic silane to the resist layer before the patternwise crosslinking the resist layer. In an embodiment, the amine is ammonia or hydrazine. In an embodiment, the method includes forming a silicon oxide or silicon nitride over the resist layer before patternwise crosslinking the photoresist layer.

Another embodiment of the disclosure is a method of patterning a photoresist layer, including depositing a photoresist layer over a substrate by a vapor phase deposition operation. The photoresist layer includes a reaction product of a silicon free organometallic compound and a compound selected from the group consisting of an amine, a borane, a phosphine, and combinations thereof. The photoresist layer is selectively exposed to actinic radiation to form a latent pattern in the photoresist layer. Portions of the photoresist layer not exposed to the actinic radiation are removed to form a pattern of remaining portions of the photoresist layer that were exposed to the actinic radiation during the selectively exposing the photoresist layer. In an embodiment, the method includes removing portions of the substrate exposed by the removing portions of the photoresist layer. In an embodiment, the removing portions of the substrate includes dry etching the substrate. In an embodiment, the removing the portions of the photoresist layer includes applying a plasma to the photoresist layer. In an embodiment, the vapor phase deposition operation includes atomic layer deposition or chemical vapor deposition. In an embodiment, the amine, borane, or phosphine includes a halide substituent. In an embodiment, the actinic radiation is extreme ultraviolet radiation. In an embodiment, the method includes after the selectively exposing the photoresist layer to actinic radiation, heating the photoresist layer at a temperature ranging from 100° C. to 200° C. In an embodiment, the method includes exposing the photoresist layer to infrared, visible, or near-ultraviolet radiation before the selectively exposing the photoresist layer to actinic radiation. In an embodiment, the method includes heating the photoresist layer at a temperature of 40° C. to 120° C. before selectively exposing the photoresist layer to actinic radiation. In an embodiment, the amine is ammonia or hydrazine. In an embodiment, the method includes forming a silicon oxide or silicon nitride over the photoresist layer before selectively exposing the photoresist layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    depositing a photoresist composition comprising a first compound and a second compound over a substrate surface via atomic layer deposition (ALD) or chemical vapor deposition (CVD) to form a photoresist layer,
    wherein the depositing a photoresist composition includes:
        combining the first compound and the second compound in a vapor state to form the photoresist composition,
        wherein the first compound is at least one of a sec-hexyl tris (dimethylamino) tin, t-hexyl tris (dimethylamino) tin, i-hexyl tris (dimethylamino) tin, n-hexyl tris (dimethylamino) tin, sec-pentyl tris (dimethylamino) tin, t-pentyl tris (dimethylamino) tin, i-pentyl tris (dimethylamino) tin, n-pentyl tris (dimethylamino) tin, sec-butyl tris (dimethylamino) tin, t-butyl tris (dimethylamino) tin, i-butyl tris (dimethylamino) tin, n-butyl tris (dimethylamino) tin, sec-butyl tris (dimethylamino) tin, i-propyl (tris) dimethylamino tin, n-propyl tris (diethylamino) tin, and analogous alkyl (tris) (t-butoxy) tin compounds, including sec-hexyl tris (t-butoxy) tin, t-hexyl tris (t-butoxy) tin, i-hexyl tris (t-butoxy) tin, n-hexyl tris (t-butoxy) tin, sec-pentyl tris (t-butoxy) tin, t-pentyl tris (t-butoxy) tin, i-pentyl tris (t-butoxy) tin, n-pentyl tris (t-butoxy) tin, t-butyl tris (t-butoxy) tin, i-butyl tris (butoxy) tin, n-butyl tris (butoxy) tin, sec-butyl tris (butoxy) tin, i-propyl (tris) dimethylamino tin, or n-propyl tris (butoxy) tin, and
    the second compound is at least one of an amine, a borane, or a phosphine; selectively exposing the photoresist layer to actinic radiation to form a latent pattern;
    developing the latent pattern by applying a developer to the selectively exposed photoresist layer to form a pattern exposing a portion of the substrate surface; and
    removing a portion of the substrate exposed by the developing.

2. The method according to claim 1, wherein the removing a portion of the substrate by the developing includes etching the substrate.

3. The method according to claim 1, wherein the actinic radiation is extreme ultraviolet radiation.

4. The method according to claim 1, further comprising after selectively exposing the photoresist layer to actinic radiation to form a latent pattern and before developing the latent pattern, heating the photoresist layer at a temperature ranging from 100° C. to 200° C.

5. The method according to claim 1, wherein the first compound is substituted with one or more fluoro groups.

6. A method of manufacturing a semiconductor device, comprising:
    forming a photoresist layer over a substrate, comprising:
        combining a first precursor and a second precursor in a vapor state to form a photoresist material,
        wherein the first precursor is an organometallic having a formula:

where M comprises Sn,
    R is a substituted or unsubstituted alkyl, alkenyl, or carboxylate group,
    X is a halide or sulfonate group, and
    $1 \le a \le 2$, $b \ge 1$, $c \ge 1$, and $b+c \le 5$, and
    the second precursor is at least one of an amine, a borane, or a phosphine; and
    depositing the photoresist material over the substrate;
    selectively exposing the photoresist layer to actinic radiation to form a latent pattern; and
    developing the latent pattern by applying a developer to the selectively exposed photoresist layer to form a pattern.

7. The method according to claim 6, wherein the actinic radiation is extreme ultraviolet radiation.

8. The method according to claim 6, further comprising after selectively exposing the photoresist layer to actinic radiation to form a latent pattern and before developing the latent pattern, baking the photoresist layer.

9. The method according to claim 6, wherein the alkyl, alkenyl, or carboxylate group is substituted with one or more fluoro groups.

10. The method according to claim 6, wherein the sulfonate group is substituted with one or more amine groups.

11. The method according to claim 6, wherein the photoresist material is deposited over the substrate by atomic layer deposition (ALD) or chemical vapor deposition (CVD).

12. The method according to claim 6, further comprising exposing the photoresist layer to infrared, visible, or near-ultraviolet radiation before selectively exposing the photoresist layer to actinic radiation.

13. The method according to claim 6, further comprising forming an amorphous carbon-containing layer over the substrate before forming the photoresist layer.

14. The method according to claim 6, further comprising forming a carbon-based polymer layer over the substrate before forming the photoresist layer.

15. The method according to claim 6, further comprising applying an organic silane to the photoresist layer before selectively exposing the photoresist layer to actinic radiation.

16. The method according to claim 6, wherein M further comprises one or more of: Bi, Sb, In, Te, Ti, Zr, Hf, V, Co, Mo, W, Al, Ga, Si, Ge, P, As, Y, La, Ce, or Lu.

17. A method of manufacturing a semiconductor device, comprising:

introducing a first compound and a second compound into a chamber at a same time to form a composition of the first compound and the second compound;

depositing the composition of the first compound and the second compound over a substrate via chemical vapor deposition (CVD) to form a layer of the composition, wherein the first compound is an organometallic compound including tin and the second compound is selected from the group consisting of an amine, a borane, a phosphine, and combinations thereof;

patternwise exposing the layer of the composition to actinic radiation to form a latent pattern; and developing the patternwise exposed layer of the composition to form a patterned layer of the composition.

18. The method according to claim 17, wherein the amine, borane, or phosphine includes a halide substituent.

19. The method according to claim 17, further comprising exposing the layer of the composition to infrared, visible, or near-ultraviolet radiation before patternwise exposing the layer of the composition to actinic radiation.

20. The method according to claim 17, further comprising forming a polymer layer over the substrate before depositing the composition.

* * * * *